(12) United States Patent
Li

(10) Patent No.: US 9,045,688 B2
(45) Date of Patent: Jun. 2, 2015

(54) LED LIGHTING ARRANGEMENT INCLUDING LIGHT EMITTING PHOSPHOR

(75) Inventor: Yi-Qun Li, Danville, CA (US)

(73) Assignee: Intematix Corporation, Fremont, CA (US)

(*) Notice: Subject to any disclaimer, the term of this patent is extended or adjusted under 35 U.S.C. 154(b) by 0 days.

(21) Appl. No.: 13/441,714

(22) Filed: Apr. 6, 2012

(65) Prior Publication Data

US 2012/0187441 A1 Jul. 26, 2012

Related U.S. Application Data

(63) Continuation of application No. 11/640,533, filed on Dec. 15, 2006, now abandoned.

(60) Provisional application No. 60/835,601, filed on Aug. 3, 2006.

(51) Int. Cl.
*H01J 1/62* (2006.01)
*C09K 11/77* (2006.01)
(Continued)

(52) U.S. Cl.
CPC .......... *C09K 11/7734* (2013.01); *C09K 11/0883* (2013.01); *C09K 11/7741* (2013.01); *C09K 11/7774* (2013.01); *F21V 5/041* (2013.01); *F21V 9/16* (2013.01); *F21Y 2101/02* (2013.01); *F21Y 2101/025* (2013.01); *F21Y 2103/003* (2013.01); *F21V 3/0481* (2013.01)

(58) Field of Classification Search
USPC .................................................. 313/498–512
See application file for complete search history.

(56) References Cited

U.S. PATENT DOCUMENTS

| 3,290,255 A | 12/1966 | Smith |
| 3,593,055 A | 7/1971 | Geusic et al. |

(Continued)

FOREIGN PATENT DOCUMENTS

| CA | 2466979 | 11/2005 |
| CN | 101375420 A | 2/2009 |

(Continued)

OTHER PUBLICATIONS

First Office Action for Chinese Patent Application No. 200780032995.8 Issued on Mar. 19, 2010.
(Continued)

*Primary Examiner* — Anne Hines
(74) *Attorney, Agent, or Firm* — Vista IP Law Group, LLP

(57) ABSTRACT

A method of manufacturing an LED lighting arrangement, comprises: receiving an optical component having a diffusing material that is light diffusive and at least one photoluminescent material that is excitable by light of a first wavelength range and which emits light of a second wavelength range; receiving an LED assembly that is operable to generate the light of the first wavelength range and mounting the optical component to the LED assembly to form the LED lighting arrangement. The optical component having the diffusing and photoluminescent materials is mass produced separately from the LED assembly and can be selected such that light generated by the optical component combined with the light generated by the LED assembly corresponds to light of a selected color. Also disclosed are LED lighting arrangements, components for LED lighting arrangements and methods of fabricating an optical component.

15 Claims, 8 Drawing Sheets

(51) Int. Cl.
*C09K 11/08* (2006.01)
*F21V 5/04* (2006.01)
*F21V 9/16* (2006.01)
*F21V 3/04* (2006.01)
*F21Y 101/02* (2006.01)
*F21Y 103/00* (2006.01)

(56) References Cited

U.S. PATENT DOCUMENTS

| | | |
|---|---|---|
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martie et al. |
| 3,763,405 A | 10/1973 | Mitsuhata |
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kano et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoeberl |
| 4,176,294 A | 11/1979 | Thornton, Jr. |
| 4,176,299 A | 11/1979 | Thornton |
| 4,191,943 A | 3/1980 | Cairns et al. |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,371,434 A | 12/1994 | Rawlings |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,947,587 A | 9/1999 | Keuper et al. |
| 5,959,316 A | 9/1999 | Lowery |
| 5,962,971 A | 10/1999 | Chen |
| 5,998,925 A | 12/1999 | Shimizu |
| 6,137,217 A | 10/2000 | Pappalardo et al. |
| 6,147,367 A | 11/2000 | Yang et al. |
| 6,252,254 B1 | 6/2001 | Soules et al. |
| 6,255,670 B1 | 7/2001 | Srivastava et al. |
| 6,340,824 B1 | 1/2002 | Komoto et al. |
| 6,504,301 B1 | 1/2003 | Lowery |
| 6,538,375 B1 | 3/2003 | Duggal et al. |
| 6,555,958 B1 | 4/2003 | Srivastava et al. |
| 6,576,488 B2 | 6/2003 | Collins et al. |
| 6,576,930 B2 | 6/2003 | Reeh et al. |
| 6,580,097 B1 * | 6/2003 | Soules et al. .......... 257/100 |
| 6,583,550 B2 | 6/2003 | Iwasa et al. |
| 6,600,175 B1 | 7/2003 | Baretz et al. |
| 6,614,170 B2 | 9/2003 | Wang et al. |
| 6,642,618 B2 | 11/2003 | Yagi et al. |
| 6,642,652 B2 | 11/2003 | Collins et al. |
| 6,653,765 B1 | 11/2003 | Levinson et al. |
| 6,660,332 B2 | 12/2003 | Kawase et al. |
| 6,680,569 B2 | 1/2004 | Mueeller-Mach et al. |
| 6,709,132 B2 | 3/2004 | Ishibashi |
| 6,717,353 B1 | 4/2004 | Mueller et al. |
| 6,812,500 B2 | 11/2004 | Reeh et al. |
| 6,834,979 B1 | 12/2004 | Cleaver et al. |
| 6,860,628 B2 | 3/2005 | Robertson et al. |
| 6,869,812 B1 | 3/2005 | Liu |
| 6,903,380 B2 | 6/2005 | Barnett et al. |
| 7,029,935 B2 | 4/2006 | Negley et al. |
| 7,153,015 B2 | 12/2006 | Brukilacchio |
| 7,220,022 B2 | 5/2007 | Allen et al. |
| 7,311,858 B2 | 12/2007 | Wang |
| 7,390,437 B2 | 6/2008 | Dong |
| 7,479,662 B2 | 1/2009 | Soules et al. |
| 7,575,697 B2 | 8/2009 | Li |
| 7,601,276 B2 | 10/2009 | Li |
| 7,615,795 B2 | 11/2009 | Baretz et al. |
| 7,655,156 B2 | 2/2010 | Cheng |
| 7,663,315 B1 | 2/2010 | Hulse |
| 7,686,478 B1 | 3/2010 | Hulse et al. |
| 7,943,945 B2 | 5/2011 | Baretz et al. |
| 7,943,951 B2 | 5/2011 | Kim et al. |
| 7,972,030 B2 | 7/2011 | Li |
| 8,274,215 B2 | 9/2012 | Liu |
| 2001/0000622 A1 | 5/2001 | Reeh et al. |
| 2001/0033135 A1 | 10/2001 | Duggal et al. |
| 2002/0047516 A1 | 4/2002 | Iwasa et al. |
| 2002/0180351 A1 | 12/2002 | McNulty et al. |
| 2003/0038596 A1 | 2/2003 | Ho |
| 2003/0052595 A1 | 3/2003 | Ellens et al. |
| 2003/0067264 A1 | 4/2003 | Takekuma |
| 2003/0102810 A1 | 6/2003 | Cross et al. |
| 2004/0016908 A1 | 1/2004 | Hohn et al. |
| 2004/0016938 A1 | 1/2004 | Baretz et al. |
| 2004/0104391 A1 | 6/2004 | Maeda et al. |
| 2004/0183081 A1 | 9/2004 | Shishov |
| 2004/0190304 A1 | 9/2004 | Sugimoto et al. |
| 2004/0227465 A1 | 11/2004 | Menkara et al. |
| 2004/0239242 A1 | 12/2004 | Mano |
| 2005/0051782 A1 | 3/2005 | Negley et al. |
| 2005/0052885 A1 | 3/2005 | Wu |
| 2005/0057917 A1 | 3/2005 | Yatsuda et al. |
| 2005/0068776 A1 | 3/2005 | Ge |
| 2005/0093430 A1 | 5/2005 | Ibbetson et al. |
| 2005/0168127 A1 | 8/2005 | Shei et al. |
| 2005/0239227 A1 | 10/2005 | Aanegola et al. |
| 2005/0243550 A1 | 11/2005 | Stekelenburg |
| 2006/0001352 A1 | 1/2006 | Maruta et al. |
| 2006/0007690 A1 | 1/2006 | Cheng |
| 2006/0027786 A1 | 2/2006 | Dong et al. |

(56) References Cited

U.S. PATENT DOCUMENTS

| | | |
|---|---|---|
| 2006/0028122 A1 | 2/2006 | Wang et al. |
| 2006/0028837 A1 | 2/2006 | Mrakovich |
| 2006/0049416 A1 | 3/2006 | Baretz et al. |
| 2006/0097245 A1 | 5/2006 | Aanegola et al. |
| 2006/0124947 A1 | 6/2006 | Mueller et al. |
| 2006/0158090 A1 | 7/2006 | Wang et al. |
| 2006/0244358 A1 | 11/2006 | Kim et al. |
| 2006/0261309 A1 | 11/2006 | Li et al. |
| 2006/0262532 A1 | 11/2006 | Blumel |
| 2007/0029526 A1 | 2/2007 | Cheng et al. |
| 2007/0045644 A1* | 3/2007 | Han et al. .................. 257/98 |
| 2007/0091601 A1 | 4/2007 | Hsieh et al. |
| 2007/0120135 A1 | 5/2007 | Soules et al. |
| 2007/0170840 A1 | 7/2007 | Chang-Hae et al. |
| 2007/0240346 A1 | 10/2007 | Li et al. |
| 2008/0062672 A1 | 3/2008 | Pang et al. |
| 2008/0111472 A1 | 5/2008 | Liu |
| 2008/0130285 A1 | 6/2008 | Negley et al. |
| 2008/0218992 A1 | 9/2008 | Li |
| 2008/0224597 A1 | 9/2008 | Baretz et al. |
| 2008/0224598 A1 | 9/2008 | Baretz et al. |
| 2008/0246044 A1 | 10/2008 | Pang |
| 2008/0308825 A1 | 12/2008 | Chakraborty et al. |
| 2009/0026908 A1 | 1/2009 | Bechtel et al. |
| 2009/0050911 A1 | 2/2009 | Chakraborty |
| 2009/0219713 A1 | 9/2009 | Siemiet et al. |
| 2009/0267099 A1 | 10/2009 | Sakai |
| 2009/0272996 A1 | 11/2009 | Chakraborty |
| 2009/0283721 A1 | 11/2009 | Liu |
| 2010/0188613 A1 | 7/2010 | Tsukahara et al. |
| 2011/0147778 A1 | 6/2011 | Ichikawa |
| 2011/0149548 A1 | 6/2011 | Yang et al. |
| 2012/0051058 A1 | 3/2012 | Sharma et al. |
| 2012/0086034 A1 | 4/2012 | Yuan |

FOREIGN PATENT DOCUMENTS

| | | |
|---|---|---|
| CN | 101421855 A | 4/2009 |
| EP | 647694 | 4/1995 |
| GB | 2 017 409 | 10/1979 |
| GB | 2366610 | 3/2002 |
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | 07094785 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | H1173922 | 3/1999 |
| JP | H11251640 A | 9/1999 |
| JP | 2000031548 A | 1/2000 |
| JP | 2001177153 A | 6/2001 |
| JP | 2002133910 A | 5/2002 |
| JP | 2003101078 | 4/2003 |
| JP | P2003-234513 | 8/2003 |
| JP | 2005011953 | 1/2005 |
| JP | P3724490 | 9/2005 |
| JP | P3724498 | 9/2005 |
| JP | 2005330459 | 12/2005 |
| JP | 2011192793 A | 9/2011 |
| KR | 10-2007-0065486 A | 6/2007 |
| KR | 10-2009-0017346 A | 2/2009 |
| RU | 214492 | 6/1998 |
| TW | 200527664 | 8/2005 |
| WO | WO 9108508 | 6/1991 |
| WO | WO 0207228 | 1/2002 |
| WO | WO 2004021461 A2 | 3/2004 |
| WO | WO 2004077580 | 9/2004 |
| WO | WO 2005025831 | 3/2005 |
| WO | WO 2006022792 | 3/2006 |
| WO | WO 2007130357 A2 | 11/2007 |
| WO | WO 2008019041 A2 | 2/2008 |
| WO | WO 2008043519 A1 | 4/2008 |
| WO | WO 2010074963 A1 | 1/2010 |

OTHER PUBLICATIONS

Second Office Action for Chinese Patent Application No. 200780032995.8 Issued on Aug. 10, 2011.
Third Office Action for Chinese Patent Application No. 200780032995.8 Issued on Dec. 12, 2011.
Foreign Office Action dated Oct. 29, 2012 for Chinese Appln. No. 200780032995.8.
Foreign Office Action for Japanese Application No. 2009-522877 mailed on Apr. 24, 2012.
Yoo, J.S., et al., Control of Spectral Properties of Strontium-Alkaline Earth-Silicate-Europiem Phosphors for LED Applications, Journal of the Electrochemical Society, Apr. 1, 2005 pp. G382-G385, vol. 152, No. 5.
Supplementary European Search Report for EP 07811039.2, Apr. 15, 2011, 15 pages.
Foreign Office Action dated Jul. 5, 2012 for European Appln. No. 07811039.2.
Non-Final Office Action Mailed on Mar. 24, 2011 for U.S. Appl. No. 12/624,900.
Non-Final Office Action Mailed on Jun. 25, 2012 for U.S. Appl. No. 12/624,900.
Final Office Action Mailed on Dec. 19, 2011 for U.S. Appl. No. 12/624,900.
Park J.K., et al., Optical Properties of Eu2+ Activated Sr2Sio4 Phosphor for Light-Emitting Diodes, Electrochemical and Solid-State Letters, Feb. 25, 2004, pp. H15-H17, vol. 7, No. 5.
Barry, T., Flurrescence of EU2+ Activated Phases in Bunary Alkaline Earth Orthosilicate Systems, Journal of the Electrochemical Society, Nov. 1968, pp. 1181-1184, vol. 115, No. 1.
International Search Report and the Written Opinion dated Aug. 15, 2008 for PCT International Application No. PCT/US2007/017299.
Non-Final Office Action Mailed on Oct. 27, 2008 for U.S. Appl. No. 11/640,533.
Final Office Action Mailed on Jun. 23, 2009 for U.S. Appl. No. 11/640,533.
Non-Final Office Action Mailed on Jan. 20, 2010 for U.S. Appl. No. 11/640,533.
Final Office Action Mailed on Sep. 9, 2010 for U.S. Appl. No. 11/640,533.
Non-Final Office Action Mailed on Mar. 3, 2011 for U.S. Appl. No. 11/640,533.
Final Office Action Mailed on Sep. 23, 2011 for U.S. Appl. No. 11/640,533.
Notice of Allowance Mailed on Aug. 12, 2011 for U.S. Appl. No. 12/624,839.
Notice of Allowance Mailed on Sep. 26, 2011 for U.S. Appl. No. 12/624,839.
Taiwanese Office Action and Search Report for ROC (Taiwan) Patent Applicatoin No. 096128666 mailed on Sep. 1, 2011.
Non-Final Office Action dated Sep. 19, 2012 for U.S. Appl. No. 13/441,714.
Non-Final Office Action dated Sep. 21, 2012 for U.S. Appl. No. 13/087,615.
Non-Final Office Action dated Sep. 27, 2012 for U.S. Appl. No. 13/436,471.

(56) References Cited

OTHER PUBLICATIONS

International Search Report and Written Opinion for PCT Application No. PCT/US11/54827.
Non-Final Office Action dated Oct. 16, 2012 for U.S. Appl. No. 13/253,031.
Foreign Office Action dated Apr. 24, 2012 for Chinese Appln. No. 201010525492.8.
CRC Handbook, 63rd Ed., (1983) p. E-201.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen_GB/Catalog/Pigments/doc4/BASF/PRD/30048274/.pdt?title=Technicai%20Datasheet&asset_type=pds/pdf&language=EN&urn=urn:documentum:eCommerce_soi_EU:09007bb280021e27.pdf:09007bb280021e27.pdf.
Saleh and Teich, Fundamentals of Photonics, New York: John Wiley & Sons, 1991, pp. 592-594.
The Penguin Dictionary of Electronics, 3rd edition, pp. 315,437-438, 509-510, copyright 1979, 1988, and 1998.
LEDs and Laser Diodes, Electus Distribution, copyright 2001, available at URL:http://www.jaycar.com.au/images_uploaded/ledlaser.Pdf.
"Fraunhofer-Gesellschafl: Research News Special 1997", http://www.fhg.de/press/md-e/md1997/sondert2.hlm,(accessed on Jul. 23, 1998), Jan. 1997, Publisher: Fraunhofer Institute.
Krames, M., et al., "Status and Future of High-Power Light-Emitting Diodes for Solid-Slate Lighting", "Journal of Display Technology", Jun. 2007, pp. 160-175, vol. 3, No. 2.
Kudryashov, V., et al., "Spectra of Superbright Blue and Green InGaN/AlGaN/GaN Light-Emitting diodes", "Journal of the European Ceramic Society", May 1996, pp. 2033-2037, vol. 17.
Lester, S., et al., "High dislocation densities in high efficiency GaN-based light-emitting diodes", "Appl. Phys. Lett.", Mar. 6, 1995, pp. 1249-1251, vol. 66, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: The Complete Story, 2nd Revised and Enlarged Edition", Oct. 2000, pp. 237-240, Publisher: Springer-Verlag.
Mar. 22, 2012 Office Action in U.S. Appl. No. 12/131,119, issued by Steven Y. Horikoshi.
Pei, Q, et al., "Polymer Light-Emitting Electrochemical Cells", "Science", Aug. 25, 1995, pp. 1086-1088, vol. 269, No. 5227.
Dictionary Definition of Phosphor, Oxford English Dictionary Online, Mar. 9, 2012 (Only partial available due to corrupt file as provided on Mar. 22, 2012 in U.S. Appl. No. 12/131,119; Request for Full Reference filed).
Feb. 21, 2012 Office Action in U.S. Appl. No. 12/131,118, issued by Abul Kalam.
Jan. 7, 2011 Office Action in U.S. Appl. No. 12/131,119, issued by Steven Y. Horikoshi.
May 4, 2010 Office Action in U.S. Appl. No. 12/131,119.
Jul. 7, 2011 Office Action in U.S. Appl. No. 12/131,118, issued by Abu I Kalam.
Jul. 14, 2011 Office Action in U.S. Appl. No. 12/131,119, issued by Steve Horikoshi.
Aug. 26, 2010 Office Action in U.S. Appl. No. 12/131,118.
Sep. 29, 2009 Office Action in U.S. Appl. No. 11/264,124, issued by Abu I Kalam.
Oct. 20, 2008 Office Action in U.S. Appl. No. 10/623,198, issued by Abu I Kalam.
Nov. 30. 2010 Office Action in U.S. Appl. No. 12/131,118.
Dec. 16. 2004 Office Action in U.S. Appl. No. 10/623,198, issued by Thao X. Le.
Jan. 29, 2007 Office Action in U.S. Appl. No. 10/623,198, issued by Thao X. Le.
Jan. 30, 2006 Office Action in U.S. Appl. No. 11/264,124, issued by Thao X. Le.
Feb. 4, 2005 Office Action in U.S. Appl. No. 10/623,198, issued by Thao X. Le.
Feb. 7, 2007 Office Action in U.S. Appl. No. 11/264,124, issued by Thao X. Le.
Feb. 26, 2008 Office Action in U.S. Appl. No. 11/264,124, issued by Abu L Kalam.
Mar. 2, 2009 Office Action in U.S. Appl. No. 10/623,198, issued by Abu I Kalam.
Mar. 4, 2011 Notice of Allowance, Notice of Allowability, Examiner's Interview Summary, Examiner's Amendment/ Comment and Examiner's Statement of Reason for Allowance in U.S. Appl. No. 11/264,124, issued by Abu I Kalam.
Mar. 7, 2008 Office Action in U.S. Appl. No. 10/623,198, issued by Abu I Kalam.
Mar. 28, 2006 Office Action in U.S. Appl. No. 10/623,198, issued by Thao X. Le.
Apr. 15, 2009 Office Action in U.S. Appl. No. 11/264.124, issued by Abu I Kalam.
Jun. 14, 2006 Office Action in U.S. Appl. No. 11/264,124, issued by Thao X. Le.
Jun. 26, 2007 Office Action in U.S. Appl. No. 10/623,198, issued by Thao X. Le.
Jul. 10, 2008 Office Action in U.S. Appl. No. 11/264,124, issued by Abu I Kalam.
Jul. 14, 2005 Notice of Allowance, Notice of Allowability, and Examiner's Statement of Reasons for Allowance in U.S. Appl. No. 10/623,198, issued by Thao X. Le.
Aug. 21, 2006 Office Action in U.S. Appl. No. 10/623,198, issued by Thao X. Le.
Aug. 24, 2007 Office Action in U.S. Appl. No. 11/264,124, issued by Thao X. Le.
Sep. 17, 2009 Notice of Allowance, Notice of Allowability, Examiner's Amendmeni/Comment, and Examiner's Statement of Reasons for Allowance in U.S. Appl. No. 10/623,198, issued by Abul Kalam.
Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.
Roman. D., "LEDs Turn A Brighter Blue", "Electronic Buyers' News", Jun. 19, 1995, pp. 28 and 35, vol. 960, Publisher: CMP Media LLC.
Bradfield, P.L., et al., "Electroluminescence from sulfur impurities in a p-n. junction formed in epitaxial silicon", "Appl. Phys. Lett", 07110/1989, pp. 10D-102, vol. 55, No. 2.
Das, N.C., et al., "Luminescence spectra of ann-channel metal-oxide-semiconductor field-effect transistor at breakdown", 1990, pp. 1152-1153, vol. 56, No. 12.
Jang, S., "Effect of Avalanche-Induced Light Emission on the Multiplication Factor in Bipolar Junction Transistors", "Solid-State Electronics", 1991, pp. 1191-1196, vol. 34, No. 11.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Yang, Y., et al., "Voltage controlled two color light-emitting electrochemical cells", "Appl. Phys. Lett.", 1996, vol. 68, No. 19.
Zanoni, E., et al., "Measurements of Avalanche Effects and Light Emission in Advanced Si and SiGe Bipolar Transistors", "Microelectronic Engineering", 1991, pp. 23-26, vol. 15.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zhiming, Chen, et al., "Amorphous thin film white-LED and its light-emitting mechanism", "Conference Record of the 1991 International Display Research Conference", Oct. 1991, pp. 122-125.
Apr. 14, 2010 Office Action in U.S. Appl. No. 11/264,124.
Adachi, C. et al., "Blue light-emitting organic electroluminescent devices", "Appl. Phys. Lett.", Feb. 26, 1990, pp. 799-801, vol. 56, No. 9.

(56) References Cited

OTHER PUBLICATIONS

Akasaki, Isamu, et al., "Photoluminescence of Mg-doped p-type GaN and electroluminescence of GaN p-n. junction LED", "Journal of Luminescence", Jan.-Feb. 1991, pp. 666-670, vol. 48-49 pt. 2.
Armaroli, N. et al., "Supramolecular Photochemistry and Photophysics.", "J. Am. Chern. Soc.", 1994, pp. 5211-5217, vol. 116.
Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.
Berggren, M. et al., "Light-emitting diodes with variable colours from polymer blends", "Nature", Dec. 1, 1994, pp. 444-446, vol. 372.
Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.
Chao, Zhang Jin, et al., "White light emitting glasses", "Journal of Solid State Chemistry", 1991, pp. 1729, vol. 93.
Comrie, M. , "Full Color LED Added to Lumex's Lineup", "EBN", Jun. 19, 1995, p. 28.
Zdanowski, Marek, "Pulse operating up-converting phosphor LED", "Electron Technol.", 1978, pp. 49-61, vol. 11, No. 3.
Forrest, S. et al. , "Organic emitters promise a new generation of displays", "Laser Focus World", Feb. 1995, pp. 99-107.
Hamada, Y. et al. , "Blue-Light-Emitting Organic Electroluminescent Devices with Oxadiazole Dimer Dyes as an Emitter", "Jpn. J. Appl. Physics", Jun. 1992, pp. 1812-1816, vol. 31.
Hamakawa, Yoshihiro, et al., "Toward a visible light display by amorphous SiC:H alloy system", "Optoelectronics—Devices and Technologies", Dec. 1989, pp. 281-294, vol. 4, No. 2.
Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.
El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.
Kido, J. et al. , "1,2,4-Triazole Derivative as an Electron Transport Layer in Organic Luminescent Devices", "Jpn. J. Appl. Phys.", Jul. 1, 1993, pp. L917-L920, vol. 32.
Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.
Kido, J. et al. , "Bright blue electroluminescence from poly(N-vinylcarbazole)", "Appl. Phys. Letters", Nov. 8, 1993, pp. 2627-2629, vol. 63, No. 19.
Larach, S., et al., "Blue emitting luminescent phosphors: Review and status", "Int'l Workshop on Electroluminescence", 1990, pp. 137-143.
Maruska, H.P., et al., "Violet luminescence of Mg-doped GaN", "Appl. Phys. Lett.", Mar. 15, 1973, pp. 303-305, vol. 22, No. 6.
Maruska, H.P., "Gallium nitride light-emitting diodes (dissertation)", "Dissertation Submitted to Stanford University", Nov. 1973.
McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.
Mimura, Hidenori, et al., "Visible electroluminescence from uc-SiC/porous Si/c-Si p-n. junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Muench, W.V., et al., "Silicon carbide light-emitting diodes with epitaxial junctions", "Solid-State Electronics", Oct. 1976, pp. 871-874, vol. 19, No. 10.
Pankove, J.I., et al., "Scanning electron microscopy studies of GaN", "Journal of Applied Physics", Apr. 1975, pp. 1647-1652, vol. 46, No. 4.
Sato, Yuichi, et al., "Full-color fluorescent display devices using a near-UV light-emitting diode", "Japanese Journal of Applied Physics", Jul. 1996, pp. L838-L839, vol. 35, No. ?A.
Tanaka, Shosaku, et al., "Bright white-light electroluminescence based on nonradiative energy transfer in Ce- and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
Ura, M. , "Recent trends of development of silicon monocarbide blue-light emission diodes", "Kinzoku", 1989, pp. 11-15, vol. 59, No. 9.
Werner, K. , "Higher Visibility for LEDs", "IEEE Spectrum", Jul. 1994, pp. 30-39.
Wojciechowski, J. et al. , "Infrared-To-Blue Up-Converting Phosphor", "Electron Technology", 1978, pp. 31-47, vol. 11, No. 3.
Yamaguchi, Y. et al., "High-Brightness SiC Blue LEDs and Their Application to Full Color LED Lamps", "Optoelectronics-Devices and Technologies", Jun. 1992, pp. 57-67, vol. 7, No. 1.
Yoshimi, Masashi, et al., "Amorphous carbon basis blue light electroluminescent device", "Optoelectronics-Devices and Technologies", Jun. 1992, pp. 69-81, vol. 7, No. 1.
Morkoc et al., "Large-band-gap SiC, 111-V nitride, and II-VI ZnSe-based semiconductor device technologies", J. Appl. Phys. 76(3), 1; Mar. 17, 1994; Illinois University.
Reexam Non-Final Office Action dated Sep. 20, 2010 for U.S. Appl. No. 90/010,940.
Reexam Non-Final Office Action dated Mar. 3, 2011 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Final Office Action dated May 24, 2012 for U.S. Appl. No. 90/010,940.
Reexam Advisory Action dated Sep. 28, 2012 for U.S. Appl. No. 90/010,940.
Final Office Action dated Jan. 30, 2013 for U.S. Appl. No. 13/087,615.
Final Office Action dated Jan. 11, 2013 for U.S. Appl. No. 12/624,900.
Final Office Action dated Mar. 1, 2013 for U.S. Appl. No. 13/253,031.
Final Office Action dated Mar. 1, 2013 for U.S. Appl. No. 13/436,471.
Notice of Allowance dated Sep. 24, 2013 for U.S. Appl. No. 13/273,212.
Notice of Allowance dated Sep. 24, 2013 for U.S. Appl. No. 13/273,217.
International Search Report and Written Opinion dated Sep. 27, 2013 for PCT Appln. No. PCT/US13/48354.
Non-Final Office Action dated Sep. 27, 2013 for U.S. Appl. No. 12/624,900.
Notice of Allowance dated Sep. 30, 2013 for U.S. Appl. No. 13/273,215.
Notice of Allowance dated Oct. 2, 2013 for U.S. Appl. No. 13/253,031.
Final Office Action dated Oct. 30, 2013 for U.S. Appl. No. 13/087,615.
Non-Final Office Action dated Nov. 12, 2013 for U.S. Appl. No. 13/436,329.
Non-Final Office Action dated Sep. 24, 2012 for U.S. Appl. No. 13/273,217.
Non-Final Office Action dated Sep. 24, 2012 for U.S. Appl. No. 13/273,215.
Non-Final Office Action dated Sep. 24, 2012 for U.S. Appl. No. 13/273,212.

(56) References Cited

OTHER PUBLICATIONS

Final Office Action dated Mar. 1, 2013 for U.S. Appl. No. 13/273,217.
Final Office Action dated Mar. 1, 2013 for U.S. Appl. No. 13/273,215.
Final Office Action dated Mar. 6, 2013 for U.S. Appl. No. 13/273,212.
Foreign Office Action dated Mar. 19, 2013 for Chinese Appl. No. 201010525492.8.
International Search Report and Written Opinion dated Mar. 28, 2013 for PCT/US2012/0598292.
International Preliminary Report on Patentability dated Apr. 9, 2013 for PCT Application No. PCT/US11/54827.
Foreign Office Action for Japanese Application No. 2009-522877 mailed on Apr. 16, 2013.
Fourth Office Action dated May 15, 2013 for Chinese Appl. No. 200780032995.8.
Advisory Action dated May 15, 2013 for U.S. Appl. No. 13/436,471.
Non-Final Office Action dated May 16, 2013 for U.S. Appl. No. 13/087,615.
Non-Final Office Action dated Jun. 13, 2013 for U.S. Appl. No. 13/273,217.
Non-Final Office Action dated Jun. 13, 2013 for U.S. Appl. No. 13/253,031.
Non-Final Office Action dated Jun. 14, 2013 for U.S. Appl. No. 13/273,215.
Non-Final Office Action dated Jun. 17, 2013 for U.S. Appl. No. 13/273,212.
Non-Final Office Action dated Jul. 18, 2013 for U.S. Appl. No. 13/436,471.
Non-Final Office Action Mailed on Jul. 25, 2013 for U.S. Appl. No. 11/640,533.
Office Action dated Feb. 12, 2014 for Chinese Patent Application No. 200780032995.
Foreign Office Action dated May 15, 2014 for European Appln. No. 07811039.2.
Office Action dated May 20, 2014 for JP Patent Appln. No. 2013-154964.
Final Office Action dated Feb. 24, 2014 for U.S. Appl. No. 12/624,900.
Non-Final Office Action dated Jun. 27, 2014 for U.S. Appl. No. 12/624,900.
Final Office Action dated Jun. 12, 2014 for U.S. Appl. No. 13/436,329.
Non-Final Office Action dated May 29, 2014 for U.S. Appl. No. 13/436,471.
Final Office Action dated Jun. 12, 2014 for U.S. Appl. No. 13/436,507.
Non-Final Office Action dated Jun. 6, 2014 for U.S. Appl. No. 14/141,275.
International Preliminary Report on Patentability dated Apr. 24, 2014 for PCT Appln. No. PCT/US2012/059892.
Foreign Office Action dated Jun. 13, 2014 for Chinese Appln. No. 200780032995.8.
Final Office Action dated Jul. 17, 2014 for U.S. Appl. No. 13/087,615.
Non-Final Office Action dated Jun. 19, 2014 for U.S. Appl. No. 14/101,247.
Office Action dated Sep. 23, 2014 for Chinese Appln. No. 201180048303.5.
Final Office Action dated Oct. 24, 2014 for U.S. Appl. No. 12/624,900.
Notice of Decision of Rejection dated Oct. 29, 2014 for Korean Appln. No. 10-2009-7004371.
Seventh Office Action dated Nov. 3, 2014 for Chinese Appln. No. 200780032995.8.
Final Office Action dated Nov. 4, 2014 for U.S. Appl. No. 13/436,471.
Non-Final Office Action dated Nov. 10, 2014 for U.S. Appl. No. 14/108,163.
Revised Final Office Action dated Nov. 13, 2014 for U.S. Appl. No. 13/436,507.
Office Action dated Dec. 16, 2014 for Japanese Appln. No. 2013-532890.
Final Office Action dated Feb. 26, 2015 for U.S. Appln. No. 14/108,163.

* cited by examiner

LED LIGHTING ARRANGEMENT INCLUDING LIGHT EMITTING PHOSPHOR

CROSS REFERENCE TO RELATED APPLICATIONS

This application is a continuation of U.S. patent application Ser. No. 11/640,533, filed Dec. 15, 2006 by Yi-Qun Li, entitled "LED Lighting Arrangement Including Light Emitting Phosphor" which claims the benefit of priority to U.S. Provisional Application No. 60/835,601, filed Aug. 3, 2006 by Yi-Qun Li, entitled "Phosphor Containing Optical Components for LED Illumination Systems," all of which are hereby incorporated by reference in their entireties.

BACKGROUND OF THE INVENTION

1. Field of the Invention

This invention relates to solid-state lighting applications which comprise light emitting diodes (LEDs) which include a light emitting phosphor, photoluminescent material, to generate light of a desired color, that is in a different part of the wavelength spectrum from the LEDs. In particular, although not exclusively, the invention concerns LED-based lighting arrangements which generate light in the visible part of the spectrum and in particular, although not exclusively white light. Moreover the invention provides an optical component for such a lighting arrangement and methods of fabricating a lighting arrangement and an optical component. Furthermore the invention provides a phosphor material for coating an optical component or as a part of optical designs in lighting arrangements.

2. State of the Art

In the context of this patent application light is defined as electromagnetic radiation in a wavelength range 300 nm (Ultraviolet) to 1000 nm (Infrared). Primarily, although not exclusively the invention concerns lighting arrangements which emit light in the visible part of the spectrum that is 380 to 750 nm.

White light emitting diodes (LEDs) are known in the art and are a relatively recent innovation. It was not until LEDs emitting in the blue/ultraviolet of the electromagnetic spectrum were developed that it became practical to develop white light sources based on LEDs. As is known white light generating LEDs ("white LEDs") include a phosphor, that is a photoluminescent material, which absorbs a portion of the radiation emitted by the LED and re-emits radiation of a different color (wavelength). For example the LED emits blue light in the visible part of the spectrum and the phosphor re-emits yellow light. Alternatively the phosphor can emit a combination of green and red light, green and yellow or yellow and red light. The portion of the visible blue light emitted by the LED which is not absorbed by the phosphor mixes with the yellow light emitted to provide light which appears to the eye as being white. A known yellow phosphor is a YAG-based phosphor having a main emission wavelength peak that varies in wavelength range from 530 to 590 nm depending on the composition of the phosphors. Further examples of phosphors are described in our co-pending patent application US 2006/0028122 in which the photoluminescent materials have a formula $A_2SiO_4:Eu^{2+}D$ where A is a divalent metal selected from the group consisting of Sr, Ca, Ba, Mg, Zn and Cd and D is a dopant selected from the group consisting of F, Cl, Br, I, P, S and N. Such phosphors emit light of intensities that are greater than either known YAG compounds or silicate-based phosphors.

It is predicted that white LEDs could potentially replace incandescent light sources due to their long operating lifetimes, typically many 100,000 of hours, and their high efficiency. Already high brightness LEDs are used in vehicle brake lights and indicators as well as traffic lights and flash lights.

To increase the intensity of light emitted from an LED it is known to include a lens made of a plastics material or glass to focus the light emission and to thereby increase intensity. Referring to FIG. 1 a high brightness white LED 2 is shown. The LED 2 comprises an LED chip 4 which is mounted within a plastic or metal reflection cup 6 and the LED chip is then encapsulated within an encapsulating material, typically an epoxy resin 8. The encapsulation material includes the phosphor material for providing color conversion. Typically the inner surface of the cup 6 is silvered to reflect stray light towards a lens 10 which is mounted on the surface of the encapsulating epoxy resin 8.

The inventor has appreciated that such an arrangement has limitations and the present invention arose in an endeavor to mitigate, at least in part, these limitations. For example for high intensity LEDs having a high intensity output larger than 1 W, the high temperature at the output of the LED combined with its close proximity the phosphor material can give rise to a light characteristic which is temperature dependent and in some cases thermal degradation of the phosphor material can occur. Moreover the uniformity of color of light emitted by such LEDs can be difficult to maintain with the phosphor distributed within the epoxy resin since light passing through different path lengths will encounter and be absorbed by differing amounts of phosphor. Furthermore the fabrication of such LEDs is time consuming due to the encapsulation and subsequent placement of the lens.

SUMMARY OF THE INVENTION

According to a first aspect of the invention there is provided a lighting arrangement comprising: a radiation source configured to emit radiation having a first wavelength range; a phosphor configured to absorb at least a portion of said first wavelength range radiation and emit radiation having a second wavelength range; and an optical component through which at least said first wavelength range radiation passes, characterized in that the phosphor is provided on a surface of the optical component. The invention provides the advantage of reducing the manufacturing steps and hence cost and also provides a more uniform color of output light.

Advantageously the phosphor is provided as a substantially uniform thickness layer on said surface of the optical component. Such an arrangement ensures a more uniform color of emitted light.

The optical component can have a number of forms and typically comprises a lens for focusing the radiation to increase the intensity of the emitted light. Alternatively the optical component can be for directing the radiation thus acting as a waveguide or as a window through which the radiation passes. The phosphor can be provided on inner or outer surfaces of the optical component and this will determine whether said second wavelength range radiation also passes through the optical component. For example in one implementation the optical component has a substantially planar surface and the phosphor is provided on said substantially planar surface. An advantage of applying the phosphor to the planar surface is that it is easier to produce a uniform thickness layer. Alternatively the optical component can have a convex or concave surface and the phosphor is provided on said convex or concave surfaces.

In one implementation the optical component has a substantially hemispherical surface and the phosphor is provided on said hemispherical surface. Preferably, the optical component comprises a substantially hemispherical shell and the phosphor is provided on the inner hemispherical surface. Alternatively the phosphor can be provided on at least a part of the outer hemispherical surface. In a further alternative embodiment the optical component comprises a substantially spherical shell and the phosphor is provided on at least a part of the inner or outer spherical surfaces. Such a form finds particular application as a light source for replacing incandescent light sources. In yet a further embodiment the optical component comprises a hollow cylinder and the phosphor is provided on at least a part of the inner or outer surfaces.

Advantageously, the optical component is made of a plastics material such as a polycarbonate and silicone or a glass such as a silica-based glass. The optical component comprises a material which is at least substantially transparent to said first wavelength range radiation and where the phosphor is provided on an inner surface of the component the material is further substantially transparent to the second wavelength range radiation.

In a preferred implementation the phosphor comprises a powder which is incorporated within an epoxy resin, a silicone material or a polymer material to form a mixture and the phosphor mixture is then applied to the optical component to form a layer of phosphor on the optical component surface. To improve the uniformity of light emitted from the lighting arrangement the phosphor mixture advantageously further incorporates a light diffusing material such as titanium oxide, silica, alumina, etc. Such a light diffusing material has as low an absorption of light as possible.

The phosphor advantageously comprises a phosphor which emits luminescent light when illuminated by radiation in wavelength range from 300 nm to 550 nm. One example of the phosphor advantageously comprises a YAG-based phosphor which comprises a photoluminescent material having a formula $(YA)_3(AlB)_5(OC)_{12}:Ce^{3+}$ where A is a trivalent metal selected from the group comprising Gd, Tb, La, Sm or divalent metal ions such as Sr, Ca, Ba, Mg, Zn and Cd, B comprising Si, B, P, and Ga and C is a dopant selected from the group comprising F, Cl, Br, I, P, S and N. In another implementation the phosphor comprises a photoluminescent material having a formula $A_2SiO_4:Eu^{2+}D$ where A is a divalent metal selected from the group comprising Sr, Ca, Ba, Mg, Zn and Cd and D is a dopant selected from the group comprising F, Cl, Br, I, P, S and N.

In yet a further embodiment an orange-red silicate-based phosphor having a formula $(SrM1)_3Si(OD)_5:Eu$ where M1 is selected from the group comprising Ba, Ca, Mg, Zn . . . and where D is selected from the group comprising F, Cl, S, and N. Such a phosphor is advantageously used for emitting light in a wavelength range from green to yellow (580 to 630 nm).

Alternatively the phosphor comprises a red silicon nitride based phosphor having a formula $(SrM1)Si_5N_8$ where M1 is selected from the group comprising Sr, Ca, Mg, and Zn.

In another embodiment the phosphor comprises a red sulfate based phosphor having a formula of $(SrM1)S$ where M1 is selected from the group comprising Ca, Ba, and Mg.

In yet another embodiment the phosphor can comprise a green sulfate based phosphor having a formula of $(SrM1)(GaM2)_2S_4:Eu$ where M1 is selected from the group comprising Ca, Ba, and Mg, and M2 is selected from the group comprising Al and In.

Preferably, the radiation source comprises a light emitting diode, advantageously a Gallium Nitride based LED.

The present invention finds particular application for white light sources and the radiation source is operable to emit radiation having a wavelength range of 300 to 500 nm. Preferably, the phosphor composition is configured to emit radiation having a wavelength ranging from 450 to 700 nm.

According to a second aspect of the invention there is provided an optical component for a lighting arrangement of a type comprising a radiation source configured to emit radiation having a first wavelength range; a phosphor configured to absorb at least a portion of said first wavelength range radiation and emit radiation having a second wavelength range; and said optical component configured such that at least said first wavelength range radiation passes through the optical component, and characterized in that said phosphor is provided on a surface of said optical component.

Such an optical component provides the advantages of reducing the manufacturing steps and hence cost and emits a more uniform color light. Moreover such an optical component can be used to provide direct color conversion in an LED arrangement.

To ensure the uniformity of color of light generated by the optical component, the phosphor is advantageously provided as a substantially uniform thickness layer on said surface of the optical component.

For ease of fabrication the optical component preferably has a substantially planar surface and the phosphor is provided on said substantially planar surface. Alternatively, the optical component has a convex or concave surface and the phosphor is provided on said convex or concave surfaces by for example spraying or printing related coating methods.

In one implementation the optical component has a substantially hemispherical surface and the phosphor is provided on said hemispherical surface. The optical component can comprise a substantially hemispherical shell and the phosphor is provided on the inner hemispherical surface. Such an arrangement provides environmental protection of the phosphor. Alternatively, the phosphor is provided on the outer hemispherical surface. In a further embodiment the optical component comprises a substantially spherical shell and the phosphor is provided on at least a part of the inner or outer spherical surfaces. In yet a further implementation the optical component comprises a hollow cylinder and the phosphor is provided on at least a part of the inner or outer surfaces.

Preferably, the phosphor comprises a powder which is incorporated within an epoxy resin, a silicone material or a polymer material to form a mixture and then the phosphor mixture is applied to the optical component to form a layer of phosphor on the optical component surface. To ensure a uniform light intensity output the phosphor mixture advantageously further comprises a light diffusing material.

Preferably, the optical component is fabricated from a plastics material or a glass.

The phosphor advantageously comprises a photoluminescent material having a formula $A_2SiO_4:Eu^{2+}D$ where A is a divalent metal selected from the group comprising Sr, Ca, Ba, Mg, Zn and Cd and D is a dopant selected from the group comprising F, Cl, Br, I, P, S and N.

According to third aspect of the invention there is provided a method of fabricating a lighting arrangement comprising: providing a radiation source configured to emit radiation having a first wavelength range and an optical component through which said radiation passes; and providing on a surface of the optical component a phosphor configured to absorb at least a portion of said first wavelength range radiation and emit radiation having a second wavelength range.

Advantageously the method further comprises providing the phosphor as a substantially uniform thickness layer on said surface of the optical component.

The optical component can have a substantially planar surface, convex or concave surfaces and the method comprises providing the phosphor on said substantially planar surface, convex or concave surfaces.

In one implementation the optical component has a substantially hemispherical surface and the method comprises providing the phosphor on said hemispherical surface. Preferably, the optical component comprises a substantially hemispherical shell and the method comprises providing the phosphor on the inner or outer hemispherical surfaces. Alternatively, the optical component can comprise a substantially spherical shell and the method comprises providing the phosphor on at least a part of the inner or outer spherical surfaces. In a further alternative arrangement the optical component comprises a hollow cylinder and the method comprises providing the phosphor on at least a part of the inner or outer surfaces.

The optical component is preferably fabricated from a plastics material or glass.

According to a further aspect of the invention there is provided a method of fabricating an optical component for a lighting arrangement of a type comprising a radiation source configured to emit radiation having a first wavelength range; a phosphor configured to absorb at least a portion of said first wavelength range radiation and emit radiation having a second wavelength range; and said optical component being configured such that at least said first wavelength range radiation passes through the optical component the method comprising providing said phosphor on a surface of the optical component.

To ensure uniform color conversion the method advantageously comprises providing the phosphor as a substantially uniform thickness layer.

When the optical component has a substantially planar surface the method preferably comprises providing the phosphor on said substantially planar surface.

Alternatively where the optical component has a convex or concave surface the method can comprise providing the phosphor on said convex or concave surfaces.

In yet a further alternative arrangement the optical component has a substantially hemispherical surface and the method comprises providing the phosphor on said hemispherical surface. Where the optical component comprises a substantially hemispherical shell the method comprises providing the phosphor on the inner or outer hemispherical surfaces. Moreover where the optical component comprises a substantially spherical shell the method comprises providing the phosphor on at least a part of the inner or outer spherical surfaces. Alternatively the optical component can comprise a hollow cylinder and the method comprises providing the phosphor on at least a part of the inner or outer surfaces.

In a preferred method the phosphor comprises a powder and the method comprises incorporating the phosphor within an epoxy resin or silicone material or polymer material to form a mixture and then applying the phosphor mixture to the optical component to form a layer of phosphor on the optical component surface. The mixture can be applied by painting the mixture onto the surface of the optical component, spraying or other known deposition techniques. When the phosphor is to be applied to a planar surface the optical component is then advantageously spun or tape casting to distribute the mixture uniformly over the surface to thereby ensure a uniform thickness of phosphor forms.

Advantageously the method further comprises incorporating a light diffusing material, for example titanium oxide, silica, alumina in the phosphor mixture. Alternatively the light diffusing material can be provided as a separate layer.

Advantageously, the phosphor comprises a photoluminescent material having a formula $A_2SiO_4:Eu^{2+}D$ where A is a divalent metal selected from the group comprising Sr, Ca, Ba, Mg, Zn and Cd and D is a dopant selected from the group comprising F, Cl, Br, I, P, S and N.

The method further comprises fabricating the optical component from a plastics material or glass.

For ease of fabrication, and in accordance with a particularly preferred method of the invention a plurality of optical components in the form of an array, said array of optical components having a common planar surface, and said phosphor is deposited on the planar surface. Advantageously, the phosphor is provided as a substantially uniform thickness layer on said planar surface of the array of optical components.

In accordance with a further aspect of the invention there is provided a phosphor material for coating an optical component of an LED comprising a phosphor powder incorporated within an epoxy resin, a silicone material or a polymer material. Advantageously the phosphor material further incorporates a light diffusing material.

In accordance with yet a further aspect of the invention there is provided an optical component for a lighting arrangement of a type comprising a radiation source configured to emit radiation having a first wavelength range; a phosphor configured to absorb at least a portion of said first wavelength range radiation and emit radiation having a second wavelength range; and said optical component being configured such that at least said first wavelength range radiation passes through the optical component, and characterized in that said phosphor is incorporated in said optical component.

DETAILED DESCRIPTION OF EMBODIMENTS OF THE INVENTION

In order that the present invention is better understood, embodiments of the invention will now be described by way of example only with reference to the accompanying drawings.

Figure 1:
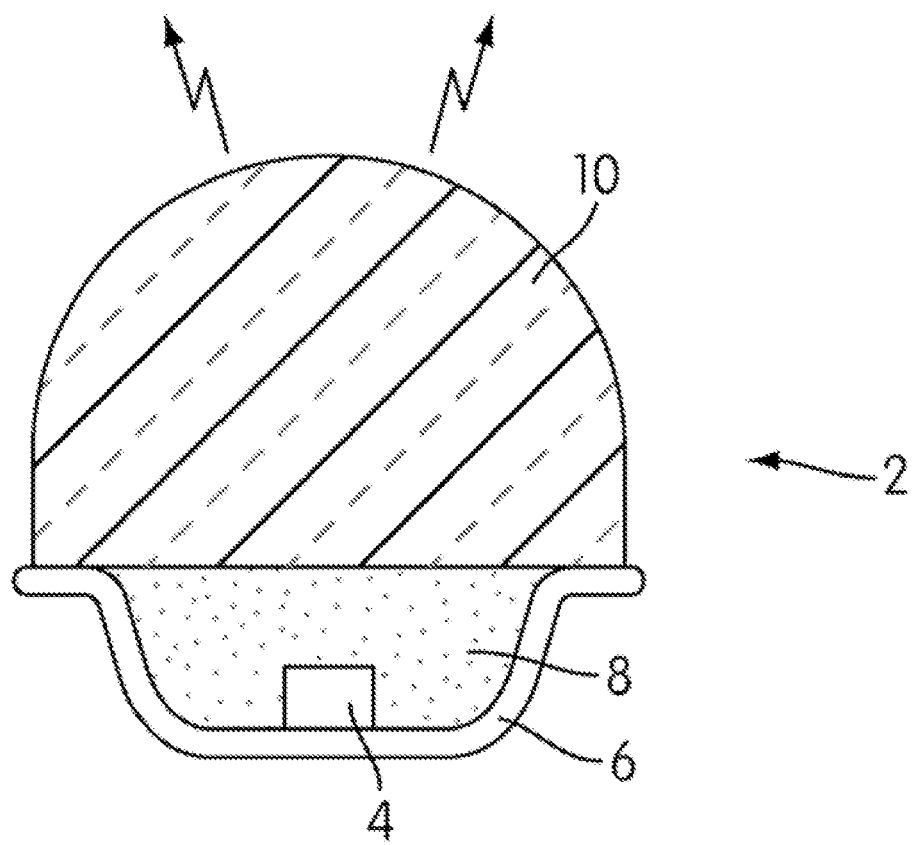
FIG. 1 is a schematic representation of a known white LED as already described.
Figure 2:
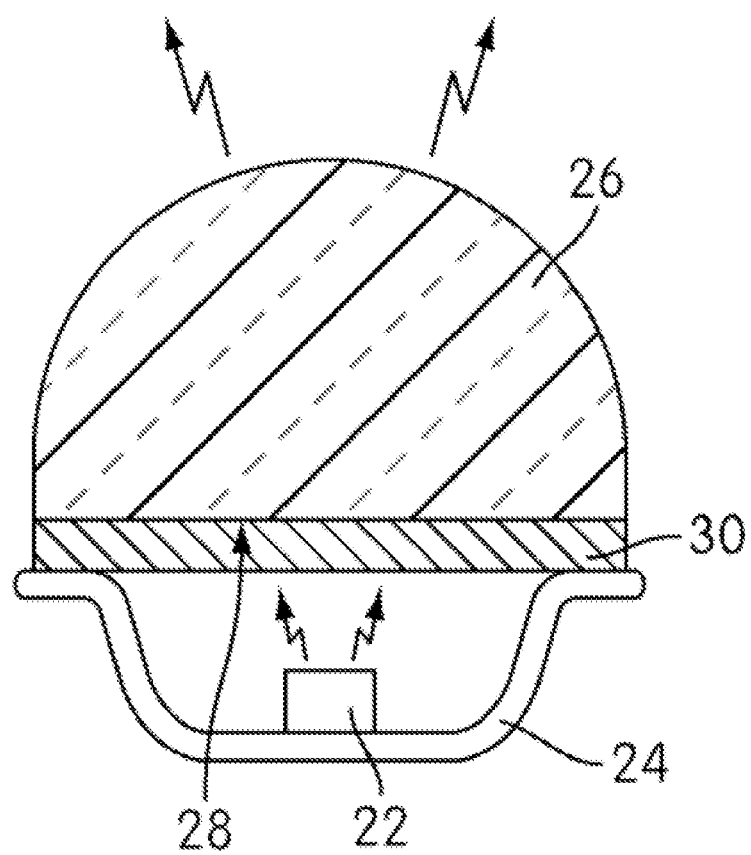
FIGS. 2 to 7 are schematic representations of LED lighting arrangements in accordance with the invention.

Referring to FIG. 2 there is shown a LED lighting arrangement 20 in accordance with the invention. The LED lighting arrangement 20 is for generating light of a selected color for example white light. The lighting arrangement comprises a LED chip 22, preferably a Gallium Nitride chip, which is operable to produce light, radiation, preferably of wavelength in a range 300 to 500 nm. The LED chip 22 is mounted inside a stainless steel enclosure or reflection cup 24 which has metallic silver deposited on its inner surface to reflect light towards the output of the lighting arrangement. A convex lens 26 is provided to focus light output from the arrangement. In the example illustrated the lens 26 is substantially hemispherical in form. The lens 26 can be made of a plastics material such as polycarbonate or glass such as silica based glass or any material substantially transparent to the wavelengths of light generated by the LED chip 22.

In the embodiment in FIG. 2 the lens 26 has a planar, substantially flat, surface 28 onto which there is provided a layer of phosphor 30 before the lens is mounted to the enclosure 22. The phosphor 30 preferably comprises a photoluminescent material having a formula $A_2SiO_4:Eu^{2+}D$ where A is a divalent metal selected from the group comprising Sr (Strontium), Ca (Calcium), Ba (Barium), Mg (Magnesium), Zn (Zinc) and Cd (Cadmium) and D is a dopant selected from the group comprising F (Fluorine), Cl (Chlorine), Br (Bromine), I (Iodine), P (Phosphorous), S (Sulfur) and N (Nitrogen) as disclosed in our co-pending patent application US 2006/0028122 the content of which is hereby incorporated by way of reference thereto. The phosphor which is in the form of a powder is mixed with an adhesive material such as epoxy or a silicone resin, or a transparent polymer material and the mixture is then applied to the surface of the lens to provide the phosphor layer 30. The mixture can be applied by painting, dropping or spraying or other deposition techniques which will be readily apparent to those skilled in the art. Moreover the phosphor mixture preferably further includes a light diffusing material such as titanium oxide, silica or alumina to ensure a more uniform light output.

The color of light emitted from the lighting arrangement can be controlled by appropriate selection of the phosphor composition as well as the thickness of the phosphor layer which will determine the proportion of output light originating from the phosphor. To ensure a uniform output color the phosphor layer is preferably of uniform thickness and has a typical thickness in a range 20 to 500 μm.

An advantage of the lighting arrangement of the invention is that no phosphor need be incorporated within the encapsulation materials in the LED package. Moreover the color of the light output by the arrangement can be readily changed by providing a different lens having an appropriate phosphor layer. This enables large scale production of a common laser package. Moreover such a lens provides direct color conversion in an LED lighting arrangement.

Figure 3:
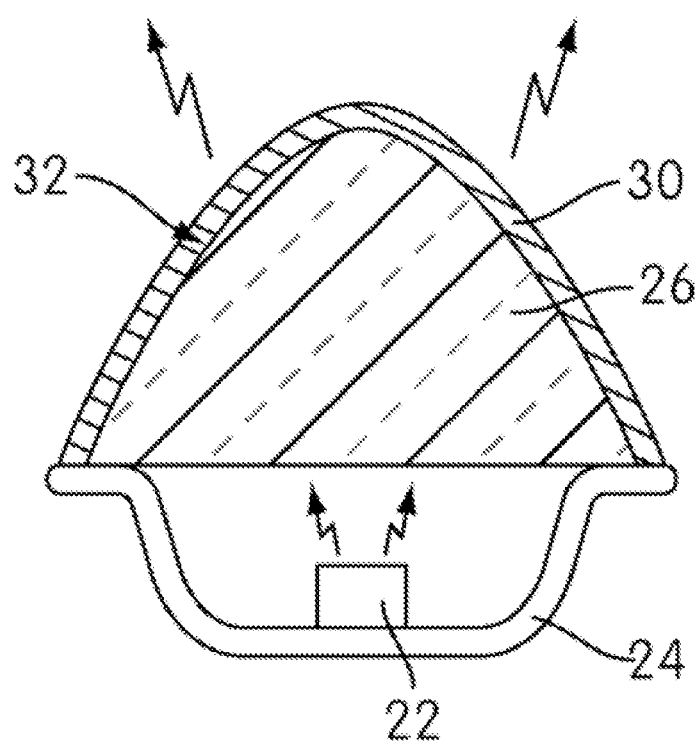

Referring to FIG. 3 there is shown an LED lighting arrangement in accordance with a further embodiment in which the phosphor 30 is provided as a layer on the outer convex surface 32 of the lens 26. In this embodiment the lens 26 is dome shaped in form.

Figure 4:
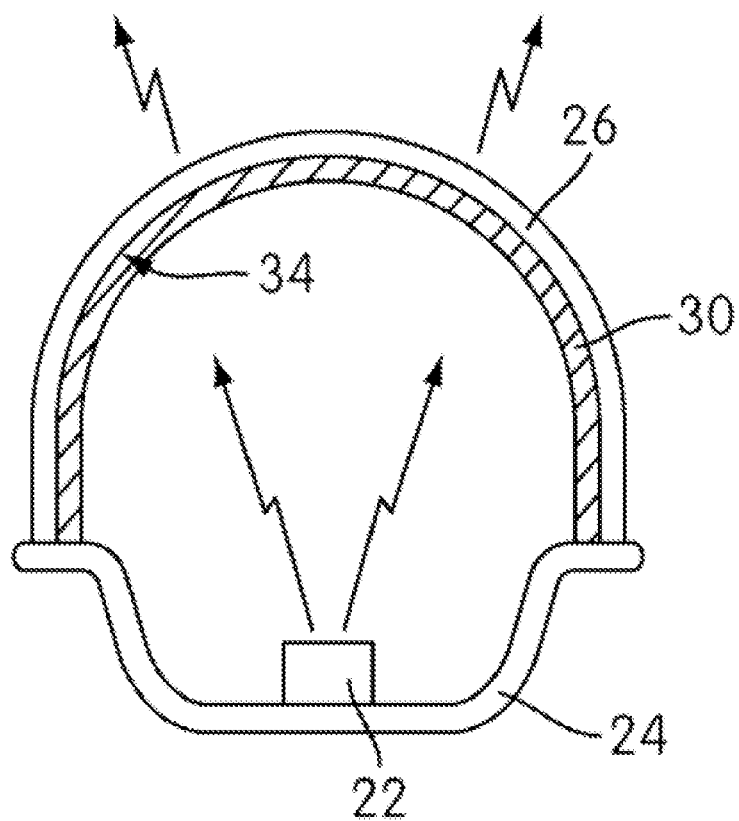

FIG. 4 shows an LED lighting arrangement in accordance with a further embodiment in which the lens 26 comprises a substantially hemispherical shell and the phosphor 30 is provided on the inner surface 34 of the lens 26. An advantage of providing the phosphor on the inner surface is that the lens 26 then provides environmental protection for the LED and phosphor. Alternatively the phosphor can be applied as a layer of the outer surface of the lens 26 (not shown).

Figure 5:
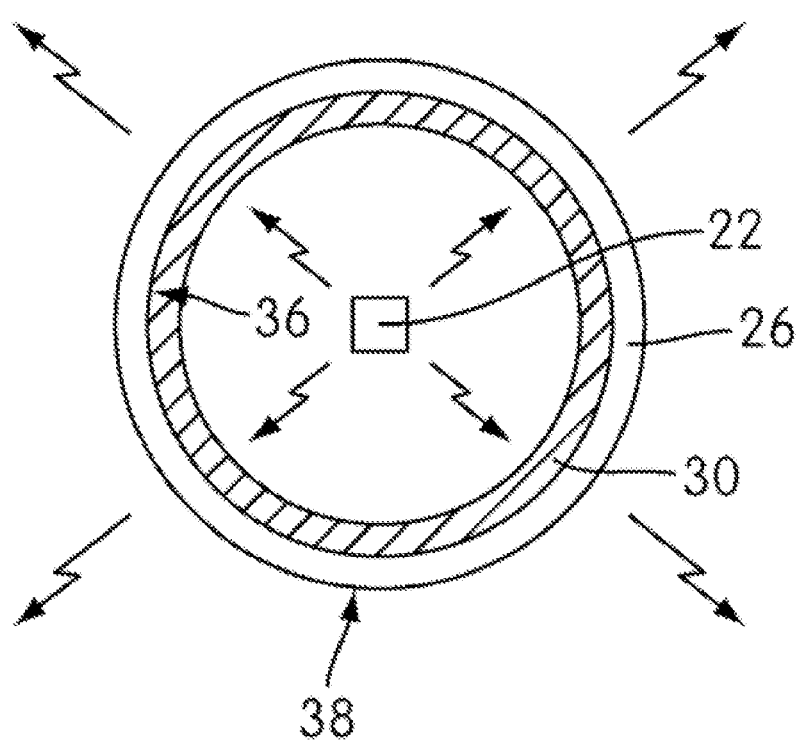

FIG. 5 illustrates an LED arrangement in which the lens 26, optical component, comprises a substantially spherical shell and the phosphor 30 is deposited as a layer on at least a part of the inner 36 or outer spherical 38 surfaces and the LED chip 22 is mounted within the spherical shell. To ensure uniform emission of radiation a plurality of LED chips are advantageously incorporated in which the chip are oriented such that they each emit light in differing directions. Such a form is preferred as a light source for replacing existing incandescent light sources (light bulbs).

Figure 6:
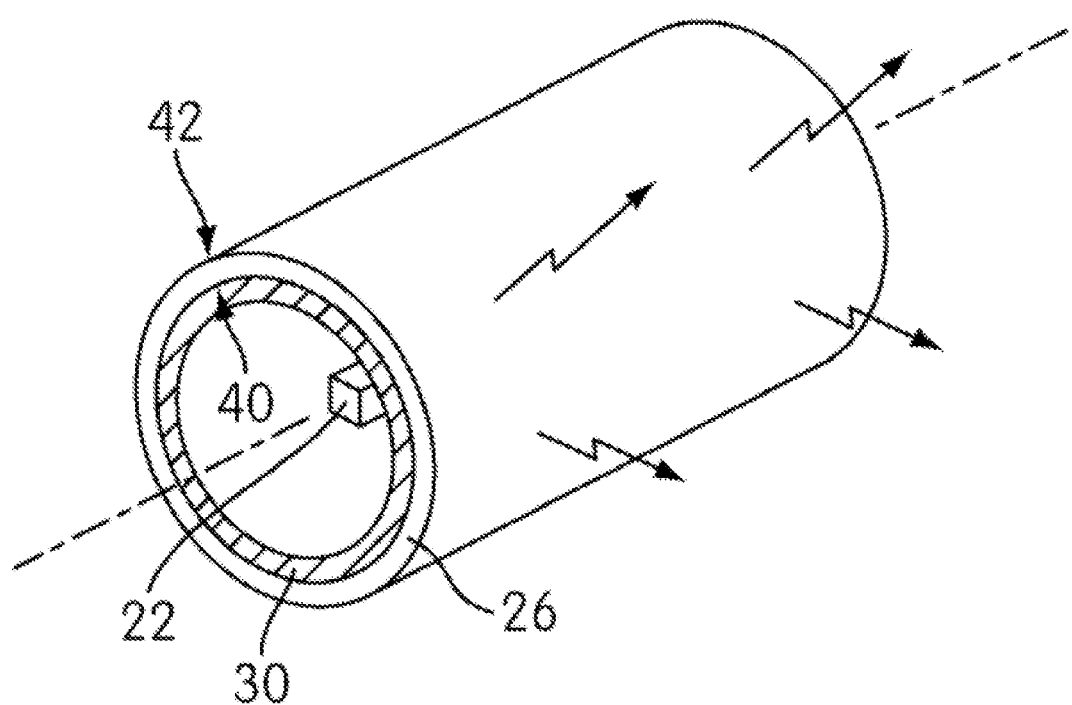

Referring to FIG. 6 there is shown a further arrangement in which the optical component 26 comprises a hollow cylindrical form and the phosphor is applied to the inner 40 or outer 42 curved surfaces. In such an arrangement the laser chip preferably comprises a linear array of laser chips that are arranged along the axis of the cylinder. Alternatively the lens 26 can comprise a solid cylinder (not shown).

Figure 7:
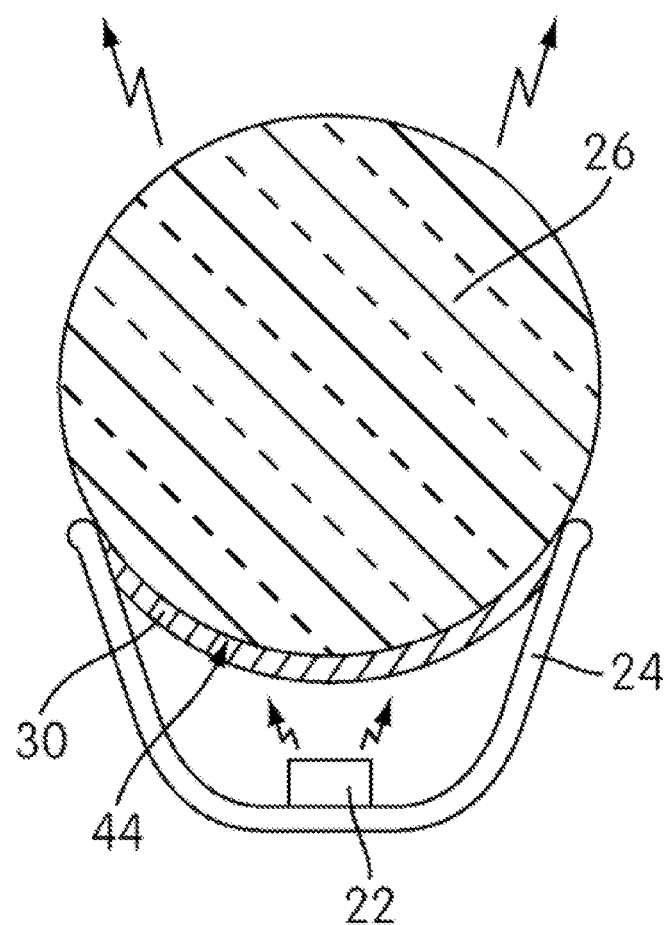

FIG. 7 shows an LED arrangement in which the optical component comprise a solid substantially spherical lens 26 and the phosphor is provided on at least a part of the spherical surface 44. In a preferred arrangement, as illustrated, the phosphor is applied to only a portion of the surface, which surface is then mounted within the volume defined by the enclosure. By mounting the lens 26 in this way this provides environmental protection of the phosphor 30.

Figure 8:
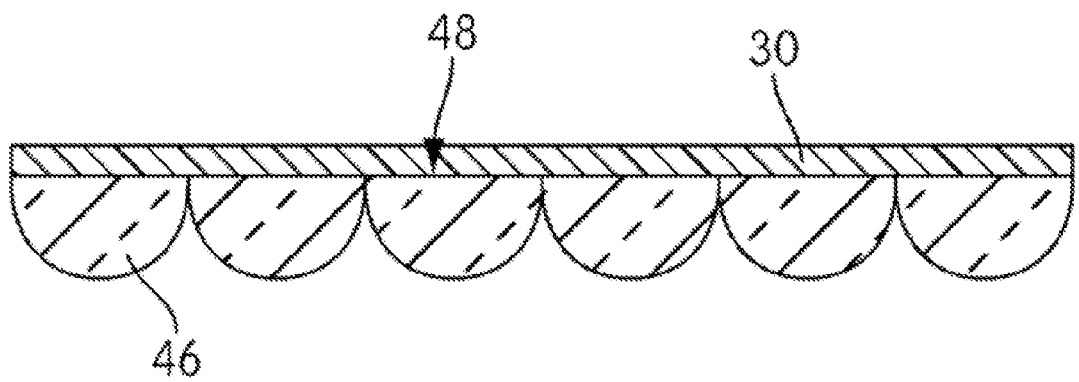
FIG. 8 is a schematic representation of a method of fabricating an optical component for an LED lighting arrangement in accordance with the invention.

Referring to FIG. 8 there is shown a preferred method of fabricating lenses in accordance with the invention. An array of lenses 46 is provided in which the lenses have a common planar surface 48 onto which the phosphor 30 is provided. In the example illustrated the lenses 36 are substantially hemispherical in form. After the phosphor has been deposited the lenses can be separated and mounted to the LED assemblies. Such a method is found to be particularly advantageous for mass production of the optical components.

It will be appreciated that the present invention is not restricted to the specific embodiments described and that modifications can be made which are within the scope of the invention. For example although in the foregoing description reference is made to a lens the phosphor can be deposited onto other optical components such as for example a window through which light passes though is not necessarily focused or directed or a waveguide which guides, directs, light. Moreover the optical component can have many forms which will be readily apparent to those skilled in the art.

It will be appreciated that the phosphor and LED chip can be selected depending on the intended application to provide light of a desired color. It is also envisaged to provide two or more phosphor materials to achieve the desired color, spectral content, of emitted light. The different phosphors can be provided by mixing the powdered material and incorporating them within a single layer or alternatively by providing multiple layers of different phosphors.

Examples of preferred phosphors are:

YAG-based phosphors which comprising a photoluminescent material having a formula $(YA)_3(AlB)_5(OC)_{12}:Ce^{3+}$ where A is a trivalent metal selected from the group comprising Gd (Gadolinium), Tb (Terbium), La (Lanthanum), Sm (Samarium) or divalent metal ions such as Sr (Strontium), Ca (Calcium), Ba (Barium), Mg (Magnesium), Zn (Zinc) and Cd (Cadmium), B comprising Si (Silicon), B (Boron), P (phosphorous), and Ga (Gadolinium) and C is a dopant selected from the group comprising F (Fluorine), Cl (Chlorine), Br (Bromine), I (Iodine), P (phosphorous), S (Sulfur) and N (Nitrogen);

orange-red silicate-based phosphors of general formula $(SrM1)_3Si(OD)_5:Eu$ where M1 is selected from the group comprising Ba, Ca, Mg, Zn . . . and D is selected from the group comprising F, Cl, S, and N (such a phosphor can be used for emitting light in a wavelength range from green to yellow (580 to 630 nm));

red silicon nitride based phosphors of general formula of $(SrM1)Si_5N_8$ where M1 is selected from the group comprising Sr, Ca, Mg, and Zn;

red sulfate based phosphors having a general formula $(SrM1)S$ where M1 is selected from the group comprising Ca, Ba, and Mg; and green sulfate based phosphors having a general formula $(SrM1)(GaM2)_2S_4:Eu$ where M1 is selected from the group comprising Ca, Ba, and Mg, and where M2 is selected from the group comprising Al and In.

In addition to providing an LED lighting arrangement the invention further provides a novel optical component and method of fabrication thereof.

In a further embodiment it is also envisaged to incorporate the phosphor within material comprising the optical component. Moreover the phosphor can be provided as a layer on the encapsulating material.

What is claimed is:

1. An LED lighting arrangement, comprising:
   an elongate optical component comprising a transparent material, and a layer containing a diffusing material, a first photoluminescent material, and a second photoluminescent material mixed together, wherein the diffusing material is light diffusive and the first and second photoluminescent materials are excitable by light of a first wavelength range and emit light of a second and third wavelength range respectively, and wherein the optical component has a hollow form; and
   an LED assembly that is operable to generate the light of the first wavelength range, wherein the optical component is separated from the LED assembly,
   wherein the optical component is mounted to the LED assembly to form the LED lighting arrangement, and wherein the LED lighting arrangement is operable to emit white light comprising a combination of light emitted by the LED assembly and light emitted by the first and second photoluminescent materials.

2. The lighting arrangement of claim 1, and wherein the layer comprises at least a part of a surface of the component selected from the group consisting of: a concave surface; a convex surface; and combinations thereof.

3. The lighting arrangement of claim 1, and wherein the layer comprises at least a part of the inner or outer surfaces of the component and wherein the component is in the form of a hollow cylinder.

4. The lighting arrangement of claim 1, and wherein the layer is of substantially uniform thickness.

5. The lighting arrangement of claim 1, and wherein the diffusing material is selected from the group consisting of: titanium dioxide; silica, alumina; and combinations thereof.

6. A component for a LED lighting arrangement, comprising:
   an optical component comprising a transparent material and having a planar surface, a layer provided on at least a portion of said planar surface, the layer containing a diffusing material, a first photoluminescent material, and a second photoluminescent material mixed together, wherein the diffusing material is light diffusive and the first and second photoluminescent materials are excitable by light of a first wavelength range and emit light of a second and third wavelength range respectively, and wherein the optical component has a hollow form,
   wherein the optical component is separated from an LED assembly to which the optical component is mountable, such that the LED lighting arrangement is operable to emit white light comprising a combination of light emitted by the LED assembly and light emitted by the first and second photoluminescent materials.

7. The component of claim 6, wherein the layer is of substantially uniform thickness.

8. The component of claim 6, and wherein the layer is provided using an approach selected from the group consisting of: spraying; dropping; printing; painting; spin coating; and tape casting.

9. The component of claim 6, and wherein the component is selected from the group consisting of: a lens; an optical window; and a waveguide.

10. The component of claim 6, and wherein the first and second photoluminescent materials comprise phosphor materials selected from the group consisting of: a YAG-based phosphor; a silicate-based phosphor; a nitride-based phosphor; a sulfate-based phosphor; and combinations thereof.

11. An LED lighting arrangement, comprising:
    an optical component comprising a transparent material having at least one planar surface, and a layer provided on at least a part of the planar surface, the layer containing a diffusing material, a first photoluminescent material, and a second photoluminescent material mixed together, wherein the diffusing material is light diffusive and the first and second photoluminescent materials are excitable by light of a first wavelength range and emit light of a second and third wavelength range respectively; and
    an LED assembly that is operable to generate the light of the first wavelength range, wherein the optical component is separated from the LED assembly,
    wherein the optical component is mounted to the LED assembly to form the LED lighting arrangement, and wherein the LED lighting arrangement is operable to emit white light comprising a combination of light emitted by the LED assembly and light emitted by the first and second photoluminescent materials.

12. The lighting arrangement of claim 11, wherein the layer is of substantially uniform thickness.

13. The lighting arrangement of claim 11, and wherein the layer is provided using an approach selected from the group consisting of: spraying; dropping; printing; painting; spin coating; and tape casting.

14. The lighting arrangement of claim 11, and wherein the component is selected from the group consisting of: a lens; an optical window; and a waveguide.

15. The lighting arrangement of claim 11, and wherein the first and second photoluminescent materials comprise phosphor materials selected from the group consisting of: a YAG-based phosphor; a silicate-based phosphor; a nitride-based phosphor; a sulfate-based phosphor; and combinations thereof.

* * * * *